United States Patent
Ko et al.

(10) Patent No.: US 9,578,740 B2
(45) Date of Patent: Feb. 21, 2017

(54) COPPER CLAD LAMINATE, PRINTED CIRCUIT BOARD, AND METHOD OF MANUFACTURING THE SAME

(71) Applicant: SAMSUNG ELECTRO-MECHANICS CO., LTD., Suwon-Si (KR)

(72) Inventors: Tae Ho Ko, Suwon-si (KR); Chang Jae Lee, Suwon-si (KR); Jun Ho Kang, Suwon-si (KR); Seok Jun Ahn, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 393 days.

(21) Appl. No.: 14/333,079

(22) Filed: Jul. 16, 2014

(65) Prior Publication Data
US 2015/0021084 A1   Jan. 22, 2015

(30) Foreign Application Priority Data

Jul. 16, 2013   (KR) .................. 10-2013-0083732

(51) Int. Cl.
*H05K 1/00*   (2006.01)
*H05K 1/03*   (2006.01)
(Continued)

(52) U.S. Cl.
CPC ............... *H05K 1/09* (2013.01); *H05K 3/427* (2013.01); *H05K 3/4652* (2013.01);
(Continued)

(58) Field of Classification Search
CPC ............. H05K 1/09; H05K 2201/0355; H05K 2201/096; H05K 3/0097; H05K 3/427; H05K 3/4652; H05K 2203/1536; Y10T 428/24355
(Continued)

(56) References Cited

U.S. PATENT DOCUMENTS

| | | | |
|---|---|---|---|
| 6,596,384 B1* | 7/2003 | Day .................... | H05K 1/0242 174/250 |
| 7,572,500 B2* | 8/2009 | Nishii ................. | H05K 3/4069 174/255 |
| 2010/0096177 A1 | 4/2010 | Lee | |

FOREIGN PATENT DOCUMENTS

| | | |
|---|---|---|
| JP | 2004-259899 | 9/2004 |
| JP | 2007-216662 | 8/2007 |
| JP | 2007-311466 | 11/2007 |

OTHER PUBLICATIONS

Office action dated Feb. 17, 2015 from corresponding Japanese Patent Application No. 2014-145132 and its English summary provided by the applicant.

(Continued)

*Primary Examiner* — Sherman Ng
(74) *Attorney, Agent, or Firm* — NSIP Law (57) ABSTRACT

Disclosed herein are a copper clad laminate, a printed circuit board, and a method of manufacturing the same. The copper clad laminate includes: an insulating layer having one surface and the other surface; and first and second copper foil layers having one surface, which is a smooth surface, and the other surface, which is a rough surface having a roughness larger than that of the smooth surface, respectively, wherein one surface of the insulating layer contacts the rough surface of the first copper foil layer and the other surface of the insulating layer contacts the smooth surface of the second copper foil layer.

6 Claims, 7 Drawing Sheets

(51) Int. Cl.
*H05K 1/09* (2006.01)
*H05K 1/11* (2006.01)
*H05K 3/42* (2006.01)
*H05K 3/46* (2006.01)
*H05K 3/00* (2006.01)

(52) U.S. Cl.
CPC ... *H05K 3/0097* (2013.01); *H05K 2201/0355* (2013.01); *H05K 2201/096* (2013.01); *H05K 2203/1536* (2013.01); *Y10T 428/24355* (2015.01)

(58) Field of Classification Search
USPC .................. 174/250, 255, 257, 261, 262
See application file for complete search history.

(56) References Cited

OTHER PUBLICATIONS

Office action dated Jul. 4, 2014 from corresponding Korean Patent Application No. 10-2013-0083732 and its English summary provided by the applicant.

\* cited by examiner

COPPER CLAD LAMINATE, PRINTED CIRCUIT BOARD, AND METHOD OF MANUFACTURING THE SAME

CROSS REFERENCE TO RELATED APPLICATION

This application claims the benefit of Korean Patent Application No. 10-2013-0083732, filed on Jul. 16, 2013, entitled "Copper Clad Laminate, Printed Circuit Board and Method for Manufacturing of the Same", which is hereby incorporated by reference in its entirety into this application.

BACKGROUND OF THE INVENTION

1. Technical Field

The present invention relates to a copper clad laminate, a printed circuit board, and a method of manufacturing the same.

2. Description of the Related Art

Recently, a trend toward multifunctionalization and a speed increase of electronic products has rapidly progressed. In accordance with this trend, a semiconductor chip and a printed circuit board on which the semiconductor chip is mounted have also been developed at a very rapid speed. In the printed circuit board as described above, thinness and lightness, fine circuit implementation, excellent electrical characteristics, high reliability, a high speed signal transfer, and the like, are demanded.

Meanwhile, according to the prior art, a core substrate preventing a warpage phenomenon of the printed circuit board by inserting a core layer thereinto has been mainly used. However, the core substrate has problems such as a thick thickness and a long signal processing period. Therefore, in order to keep up with thinness in accordance with the development of the printed circuit board, a coreless substrate capable of decreasing the entire thickness and a signal processing period by removing a core layer has been spotlighted (US Patent Laid-Open Publication No. 2010-0096177).

SUMMARY OF THE INVENTION

The present invention has been made in an effort to provide a copper clad laminate, a printed circuit board, and a method of manufacturing the same capable of decreasing a residue on the bottom surface of a via hole.

Further, the present invention has been made in an effort to provide a copper clad laminate, a printed circuit board, and a method of manufacturing the same capable of improving close adhesion of a via.

According to a preferred embodiment of the present invention, there is provided a copper clad laminate including: an insulating layer having one surface and the other surface; and first and second copper foil layers having one surface, which is a smooth surface, and the other surface, which is a rough surface having a roughness larger than that of the smooth surface, respectively, wherein one surface of the insulating layer contacts the rough surface of the first copper foil layer and the other surface of the insulating layer contacts the smooth surface of the second copper foil layer.

The rough surfaces of the first and second copper foil layers may have a roughness (Rz) of 3.5 μm or more.

The smooth surfaces of the first and second copper foil layers may have a roughness (Rz) of 2.0 to 2.5 μm.

According to another preferred embodiment of the present invention, there is provided a printed circuit board including: an insulating layer having one surface and the other surface; first and second circuit layers having one surface, which is a smooth surface, and the other surface, which is a rough surface having a roughness larger than that of the smooth surface, respectively; and a first via connecting the first and second circuit layers to each other while penetrating through the insulating layer, wherein one surface of the insulating layer contacts the rough surface of the first circuit layer and the other surface of the insulating layer contacts the smooth surface of the second circuit layer.

The rough surfaces of the first and second circuit layers may have a roughness (Rz) of 3.5 μm or more.

The smooth surfaces of the first and second circuit layers may have a roughness (Rz) of 2.0 to 2.5 μm.

According to still another preferred embodiment of the present invention, there is provided a printed circuit board including: an insulating layer having one surface and the other surface; a first circuit layer formed on one surface of the insulating layer; a second circuit layer formed on the other surface of the insulating layer; a first build-up layer formed on the insulating layer and the first circuit layer and including a first build-up insulating layer and a first build-up circuit layer; a second build-up layer formed on the insulating layer and the second circuit layer and including a second build-up insulating layer and a second build-up circuit layer; and a via formed in at least one of the insulating layer, the first build-up layer, and the second build-up layer, wherein the first circuit layer, the second circuit layer, the first build-up circuit layer, and the second build-up circuit layer have one surface, which is a smooth surface, and the other surface, which is a rough surface having a roughness larger than that of the smooth surface, respectively, and the rough surfaces of the first circuit layer, the second circuit layer, and the first build-up circuit layer face the rough surface of the second build-up circuit layer.

The rough surfaces may have a roughness (Rz) of 3.5 μm or more.

The smooth surfaces may have a roughness (Rz) of 2.0 to 2.5 μm.

When the via is formed in the insulating layer, one surface of the via may be connected to the rough surface of the first circuit layer and the other surface of the via may be connected to the smooth surface of the second circuit layer.

When the via is formed in the first build-up insulating layer, one surface of the via may be connected to the rough surface of the first build-up circuit layer and the other surface of the via may be connected to the smooth surface of the first circuit layer.

When the via is formed in the second build-up insulating layer, one surface of the via may be connected to the rough surface of the second circuit layer and the other surface of the via may be connected to the rough surface of the second build-up circuit layer.

According to yet still another preferred embodiment of the present invention, there is provided a method of manufacturing a printed circuit board, including: preparing copper clad laminates including an insulating layer having one surface and the other surface and first and second copper foil layers having one surface, which is a smooth surface, and the other surface, which is a rough surface having a roughness larger than that of the smooth surface, respectively, one surface of the insulating layer contacting the rough surface of the first copper foil layer and the other surface of the insulating layer contacting the smooth surface of the second copper foil layer; stacking the copper clad laminates on both surfaces of a carrier substrate so that rough surfaces of the copper clad laminates face each other; forming a first via hole in the copper clad laminate; performing plating on the first via hole and the first copper foil layer to form a first via and a first plating layer; removing the carrier substrate; patterning the first plating layer and the first copper foil layer to form a first circuit layer; and patterning the second copper foil layer to form a second circuit layer.

The rough surfaces may have a roughness (Rz) of 3.5 μm or more.

The smooth surfaces may have a roughness (Rz) of 2.0 to 2.5 μm.

In the forming of the first via hole, the first via hole may be processed using a laser drill.

In the forming of the first via hole, desmear may be performed after the laser drill processing.

The forming of the first circuit layer and the forming of the second circuit layer may be simultaneously performed.

The method may further include, after the forming of the first circuit layer, forming a first build-up layer on the insulating layer and the first circuit layer.

The forming of the first build-up layer may include: preparing a first build-up substrate including a first build-up insulating layer having one surface and the other surface and a third copper foil layer having one surface, which is a smooth surface, and the other surface, which is a rough surface having a roughness larger than that of the smooth surface and formed so that one surface of the first build-up insulating layer contacts the rough surface of the third copper foil layer; stacking the first build-up substrate so that the other surface of the first build-up insulating layer contacts the insulating layer and the first circuit layer; forming a second via hole in the first build-up substrate; performing plating on the second via hole and the third copper foil layer to form a second via and a second plating layer; and patterning the second plating layer and the third copper foil layer to form a first build-up circuit layer.

In the forming of the second via hole, the second via hole may be processed using a laser drill.

In the forming of the second via hole, desmear may be performed after the laser drill processing.

The rough surfaces may have a roughness (Rz) of 3.5 μm or more.

The smooth surfaces may have a roughness (Rz) of 2.0 to 2.5 μm.

The method may further include, after the forming of the second circuit layer, forming a second build-up layer on the insulating layer and the second circuit layer.

The forming of the second build-up layer may include: preparing a second build-up substrate including a second build-up insulating layer having one surface and the other surface and a fourth copper foil layer having one surface, which is a smooth surface, and the other surface, which is a rough surface having a roughness larger than that of the smooth surface and formed so that the other surface of the second build-up insulating layer contacts the smooth surface of the fourth copper foil layer; stacking the second build-up substrate so that one surface of the second build-up insulating layer contacts the insulating layer and the second circuit layer; forming a third via hole in the second build-up substrate; performing plating on the third via hole and the fourth copper foil layer to form a third via and a third plating layer; and patterning the third plating layer and the fourth copper foil layer to form a second build-up circuit layer.

In the forming of the third via hole, the third via hole may be processed using a laser drill.

In the forming of the third via hole, desmear may be performed after the laser drill processing.

The rough surfaces may have a roughness (Rz) of 3.5 μm or more.

The smooth surfaces may have a roughness (Rz) of 2.0 to 2.5 μm.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

Copper Clad Laminate

Figure 1:
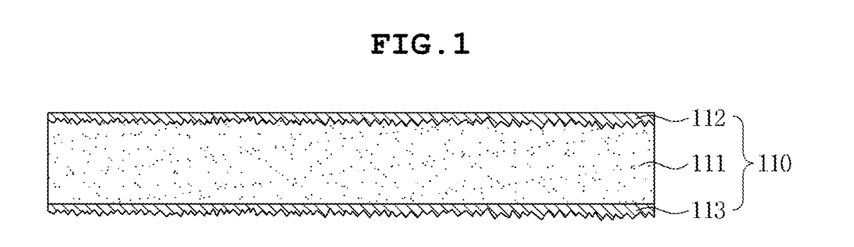
FIG. 1 is a view showing a copper clad laminate according to a preferred embodiment of the present invention.

FIG. 1 is a view showing a copper clad laminate according to a preferred embodiment of the present invention.

The copper clad laminate 110 according to the preferred embodiment of the present invention includes an insulating layer 111, a first copper foil layer 112, and a second copper foil layer 113.

The insulating layer 111 may be made of a composite polymer resin generally used as an interlayer insulating material. For example, the insulating layer 111 may be made of a prepreg or an Ajinomoto build-up film (ABF). In addition, the insulating layer 111 may be made of an epoxy resin such as FR-4 or bismaleimide triazine. The insulating layer 111 is not limited to being made of the above-mentioned material, but may be made of an interlayer insulating material that may be generally used. The insulating layer 111 may have the first copper foil layer 112 formed on one surface thereof. In addition, the insulating layer 111 may have the second copper foil layer 113 formed on the other surface thereof.

The first copper foil layer 112 may be formed on one surface of the insulating layer 111. One surface of the first copper foil layer 112 may be a smooth surface. The other surface of the first copper foil layer 112 may be a rough surface. Here, the rough surface may have a roughness larger than that of the smooth surface. According to the preferred embodiment of the present invention, the smooth surface of the first copper foil layer 112 may have a roughness (Rz) of 2.0 to 2.5 µm. In addition, the rough surface of the first copper foil layer 112 may have a roughness (Rz) of 3.5 µm or more. The rough surface of the first copper foil layer 112 may contact one surface of the insulating layer 111.

The second copper foil layer 113 may be formed on the other surface of the insulating layer 111. One surface of the second copper foil layer 113 may be a smooth surface. The other surface of the second copper foil layer 113 may be a rough surface. According to the preferred embodiment of the present invention, the smooth surface of the second copper foil layer 113 may have a roughness (Rz) of 2.0 to 2.5 µm. In addition, the rough surface of the second copper foil layer 113 may have a roughness (Rz) of 3.5 µm or more. The smooth surface of the second copper foil layer 113 may contact the other surface of the insulating layer 111.

The copper clad laminate 110 formed as described above may be formed so that the rough surfaces of the first and second copper foil layers 112 and 113 having a large roughness are directed in the same direction. Later, when a via hole (not shown) is formed in the copper clad laminate 110 according to the preferred embodiment of the present invention, the smooth surface of the second copper foil layer 113 may be the bottom surface of the via hole (not shown). Then, when a desmear process is performed, a residue of the insulating layer 111 may be easily removed due to the low roughness of the smooth surface of the second copper foil layer 113.

Printed Circuit Board

Figure 2:
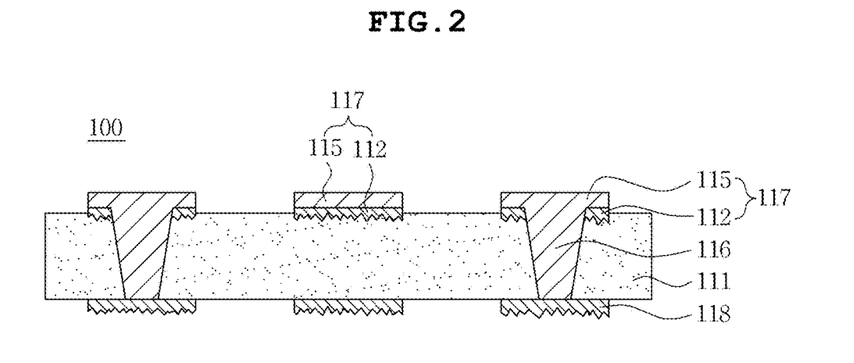
FIG. 2 is a view showing a printed circuit board according to the preferred embodiment of the present invention.

FIG. 2 is a view showing a printed circuit board 100 according to the preferred embodiment of the present invention.

Referring to FIG. 2, the printed circuit board 100 may include an insulating layer 111, a first circuit layer 117, a second circuit layer 118, and a first via 116.

According to the preferred embodiment of the present invention, the printed circuit board 100 may be formed by forming circuit patterns on the copper clad laminate 110 (See FIG. 1).

The insulating layer 111 may be made of a composite polymer resin generally used as an interlayer insulating material. For example, the insulating layer 111 may be made of a prepreg or an Ajinomoto build-up film (ABF). In addition, the insulating layer 111 may be made of an epoxy resin such as FR-4 or bismaleimide triazine. The insulating layer 111 is not limited to being made of the above-mentioned material, but may be made of an interlayer insulating material that may be generally used.

The first circuit layer 117 may be formed on one surface of the insulating layer 111. The first circuit layer 117 may include a first copper foil layer 112 and a first plating layer 115. One surface of the first copper foil layer 112 may be a smooth surface and the other surface thereof may be a rough surface having a roughness larger than that of the smooth surface. The rough surface of the first copper foil layer 112 may contact one surface of the insulating layer 111. The first copper foil layer 112 may have the first plating layer 115 formed on the smooth surface thereof. That is, the rough surface of the first circuit layer 117 having a large roughness may contact the insulating layer 111.

The second circuit layer 118 may be formed on the other surface of the insulating layer 111. According to the preferred embodiment of the present invention, the second circuit layer 118 may be formed by patterning the first copper foil layer 112 (See FIG. 1). One surface of the second circuit layer 118 may be a smooth surface and the other surface thereof may be a rough surface having a roughness larger than that of the smooth surface. The smooth surface of the second copper foil layer 118 may contact the other surface of the insulating layer 111.

According to the preferred embodiment of the present invention, the smooth surfaces of the first circuit layer 117 and the second circuit layer 118 may have a roughness (Rz) of 2.0 to 2.5 µm. In addition, the rough surface of the first circuit layer 117 and the second circuit layer 118 may have a roughness (Rz) of 3.5 µm or more.

The first via 116 may be formed in the insulating layer 111. The first via 116 may penetrate through the insulating layer 111 to connect the first and second circuit layers 117 and 118 to each other. According to the preferred embodiment of the present invention, the first via 116 may be formed on the smooth surface of the second circuit layer 118. Here, since the bottom surface of a first via hole 114 is a smooth surface having a low roughness, a less residue of the insulating layer remains as compared with the case in which the via hole is formed on the rough surface as in the prior art. In addition, according to the preferred embodiment of the present invention, when a desmear process is performed after the first via hole 114 is formed, since the roughness of the bottom surface of the first via hole 114 is low, the residue of the insulating layer may be easily removed.

Figure 3:
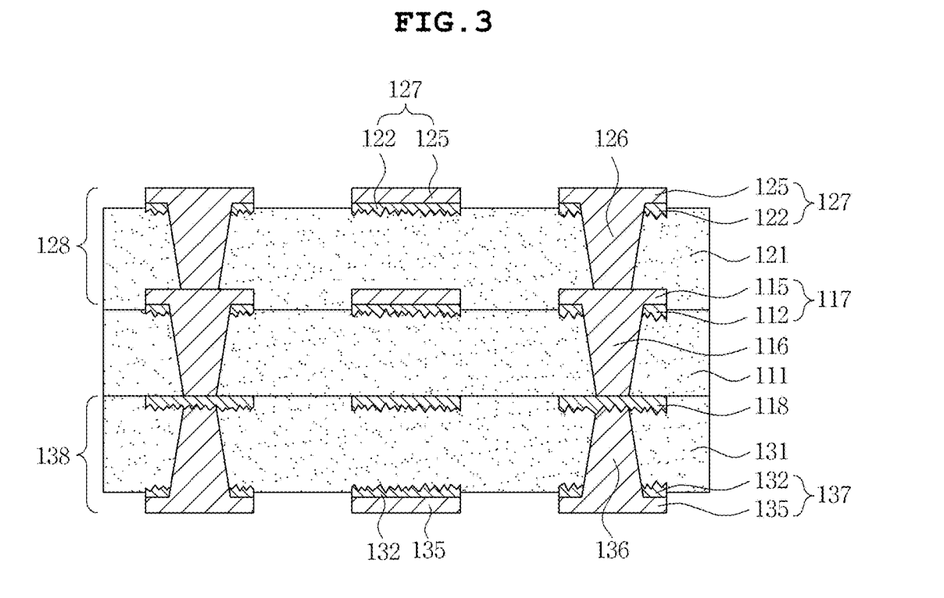
FIG. 3 is a view showing a printed circuit board according to another preferred embodiment of the present invention.

FIG. 3 is a view showing a printed circuit board 200 according to another preferred embodiment of the present invention.

Referring to FIG. 3, the printed circuit board 200 may include an insulating layer 111, a first circuit layer 117, a second circuit layer 118, a first via 116, a first build-up layer 128, and a second build-up layer 138.

The insulating layer 111 may be made of a composite polymer resin generally used as an interlayer insulating material. For example, the insulating layer 111 may be made of a prepreg or an Ajinomoto build-up film (ABF). In addition, the insulating layer 111 may be made of an epoxy resin such as FR-4 or bismaleimide triazine. The insulating layer 111 is not limited to being made of the above-mentioned material, but may be made of an interlayer insulating material that may be generally used.

The first circuit layer 117 may be formed on one surface of the insulating layer 111. The first circuit layer 117 may include a first copper foil layer 112 and a first plating layer 115. One surface of the first copper foil layer 112 may be a smooth surface and the other surface thereof may be a rough surface having a roughness larger than that of the smooth surface. The rough surface of the first copper foil layer 112 may contact one surface of the insulating layer 111. The first copper foil layer 112 may have the first plating layer 115 formed on the smooth surface thereof. That is, the rough surface of the first circuit layer 117 having a large roughness may contact the insulating layer 111.

The second circuit layer 118 may be formed on the other surface of the insulating layer 111. According to the preferred embodiment of the present invention, the second circuit layer 118 may be formed by patterning the first copper foil layer 112 (See FIG. 1). One surface of the second circuit layer 118 may be a smooth surface and the other surface thereof may be a rough surface having a roughness larger than that of the smooth surface. The smooth surface of the second copper foil layer 118 may contact the other surface of the insulating layer 111.

The first via 116 may be formed in the insulating layer 111. The first via 116 may penetrate through the insulating layer 111 to connect the first and second circuit layers 117 and 118 to each other. According to the preferred embodiment of the present invention, the first via 116 may be formed on the smooth surface of the second circuit layer 118. Here, since the bottom surface of a first via hole 114 is a smooth surface having a low roughness, a less residue of the insulating layer remains as compared with the case in which the via hole is formed on the rough surface as in the prior art. In addition, according to the preferred embodiment of the present invention, when a desmear process is performed after the first via hole 114 is formed, since the roughness of the bottom surface of the first via hole 114 is low, the residue of the insulating layer may be easily removed. When the residue of the insulating layer is decreased in the first via hole 114, close adhesion between the first via 116 and the second circuit layer 118 is improved.

The first build-up layer 128 may be formed on the insulating layer 111 and the first circuit layer 117. That is, the first build-up layer 128 may be formed on one surface of the insulating layer 111. The first build-up layer 128 may include a first build-up insulating layer 121 and a first build-up circuit layer 127.

The first build-up insulating layer 121 may be formed on the smooth surface, which is one surface of the insulating layer 111. The first build-up insulating layer 121 may be made of a composite polymer resin generally used as an interlayer insulating material. For example, the first build-up insulating layer 121 may be made of a prepreg or an Ajinomoto build-up film (ABF). In addition, the first build-up insulating layer 121 may be made of an epoxy resin such as FR-4 or bismaleimide triazine.

The first build-up circuit layer 127 may be formed on one surface of the first build-up insulating layer 121. The first build-up circuit layer 127 may include a third copper foil layer 122 and a second plating layer 125. One surface of the third copper foil layer 122 may be a smooth surface and the other surface thereof may be a rough surface having a roughness larger than that of the smooth surface. The rough surface of the third copper foil layer 122 may contact one surface of the first build-up insulating layer 121. The third copper foil layer 122 may have the second plating layer 125 formed on the smooth surface thereof. That is, the rough surface of the first build-up circuit layer 127 having a large roughness may contact the first build-up insulating layer 121.

The first build-up layer may further include a second via 126. The second via 126 may be formed in the first build-up insulating layer 121. The second via 126 may connect the first build-up circuit layer 127 and the first circuit layer 117 to each other while penetrating through the first build-up insulating layer 121. According to the preferred embodiment of the present invention, the second via 126 may be formed on the smooth surface of the first circuit layer 117. Therefore, the second via 126 may have high close adhesion to the first circuit layer 117, similar to the first via 116.

The second build-up layer 138 may be formed beneath the insulating layer 111 and the second circuit layer 118. That is, the second build-up layer 138 may be formed on the other surface of the insulating layer 111. The second build-up layer 138 may include a second build-up insulating layer 131 and a second build-up circuit layer 137.

The second build-up insulating layer 131 may be formed on the rough surface, which is the other surface of the insulating layer 111. The second build-up insulating layer 131 may be made of a composite polymer resin generally used as an interlayer insulating material. For example, the second build-up insulating layer 131 may be made of a prepreg or an Ajinomoto build-up film (ABF). In addition, the second build-up insulating layer 131 may be made of an epoxy resin such as FR-4 or bismaleimide triazine.

The second build-up circuit layer 137 may be formed on the other surface of the second build-up insulating layer 131. The second build-up circuit layer 137 may include a fourth copper foil layer 132 and a third plating layer 135. One surface of the fourth copper foil layer 132 may be a smooth surface and the other surface thereof may be a rough surface having a roughness larger than that of the smooth surface. The rough surface of the fourth copper foil layer 132 may contact the other surface of the second build-up insulating layer 131. The fourth copper foil layer 132 may have the third plating layer 135 formed on the smooth surface thereof. That is, the rough surface of the second build-up circuit layer 137 having a large roughness may contact the second build-up insulating layer 131.

The second build-up layer 138 may further include a third via 136. The third via 136 may be formed in the second build-up insulating layer 131. The third via 136 may connect the second build-up circuit layer 137 and the second circuit layer 118 to each other while penetrating through the second build-up insulating layer 131.

According to the preferred embodiment of the present invention, the smooth surfaces of the first circuit layer 117, the second circuit layer 118, the first build-up circuit layer 127, and the second build-up circuit layer 137 may have a roughness (Rz) of 2.0 to 2.5 μm. In addition, the rough surfaces of the first circuit layer 117, the second circuit layer 118, the first build-up circuit layer 127, and the second build-up circuit layer 137 may have a roughness (Rz) of 3.5 μm or more.

In the printed circuit board according to the preferred embodiment of the present invention, a roughness (Rz) of the bottom surface of the via hole is maintained to be 2.0 to 2.5 μm, such that close adhesion between the via and the copper foil layer or the circuit layer may be 0.5 kg/cm or more. When the roughness (Rz) of the bottom surface of the via hole is less than 2.0 μm, peel strength is low, such that a delamination defect, or the like, may be generated due to internal or external impact. In addition, when the roughness (Rz) of the bottom surface of the via hole exceeds 2.5 μm, a residue of the insulating layer presented by the roughness is not easily removed, such that sufficient close adhesion between the via and the copper foil layer or the circuit layer may not be maintained Method of Manufacturing Printed Circuit Board FIGS. 4 to 15 are views showing a method of manufacturing a printed circuit board according to the preferred embodiment of the present invention.

Figure 4:
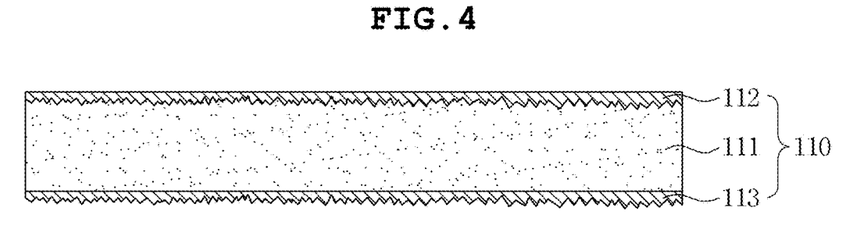
FIGS. 4 to 15 are views showing a method of manufacturing a printed circuit board according to the preferred embodiment of the present invention.

Referring to FIG. 4, a copper clad laminate 110 is prepared. The copper clad laminate 110 according to the preferred embodiment of the present invention includes an insulating layer 111, a first copper foil layer 112, and a second copper foil layer 113.

The insulating layer 111 may be made of a composite polymer resin generally used as an interlayer insulating material. For example, the insulating layer 111 may be made of a prepreg or an Ajinomoto build-up film (ABF). In addition, the insulating layer 111 may be made of an epoxy resin such as FR-4 or bismaleimide triazine. The insulating layer 111 is not limited to being made of the above-mentioned material, but may be made of an interlayer insulating material that may be generally used.

The first copper foil layer 112 may be formed on one surface of the insulating layer 111. One surface of the first copper foil layer 112 may be a smooth surface. The other surface of the first copper foil layer 112 may be a rough surface. Here, the rough surface may have a roughness larger than that of the smooth surface. The rough surface of the first copper foil layer 112 may contact one surface of the insulating layer 111.

The second copper foil layer 113 may be formed on the other surface of the insulating layer 111. One surface of the second copper foil layer 113 may be a smooth surface. The other surface of the second copper foil layer 113 may be a rough surface. The smooth surface of the second copper foil layer 113 may contact the other surface of the insulating layer 111.

According to the preferred embodiment of the present invention, the smooth surfaces of the first copper foil layer 112 and the second copper foil layer 113 may have a roughness (Rz) of 2.0 to 2.5 μm. In addition, the rough surface of the first copper foil layer 112 and the second copper foil layer 113 may have a roughness (Rz) of 3.5 μm or more.

Figure 5:
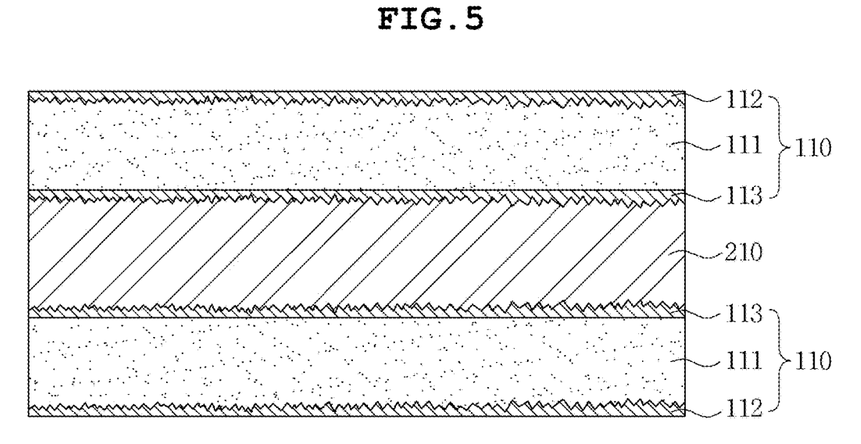

Referring to FIG. 5, the copper clad laminates 110 may be stacked on both surfaces of a carrier substrate 210. The carrier substrate 210 may include an insulating layer and metal foils stacked on both surfaces of the insulating layer. However, a material and a structure of the carrier substrate 210 are not limited thereto. That is, the carrier substrate 210 may become a carrier used when manufacturing a general coreless substrate. The copper clad laminate 110 may be stacked so that a rough surface thereof contacts the carrier substrate 210. Therefore, when the copper clad laminates 110 are stacked on both surfaces of the carrier substrate 210, the rough surfaces of the copper clad laminates 110 may face each other.

Figure 6:
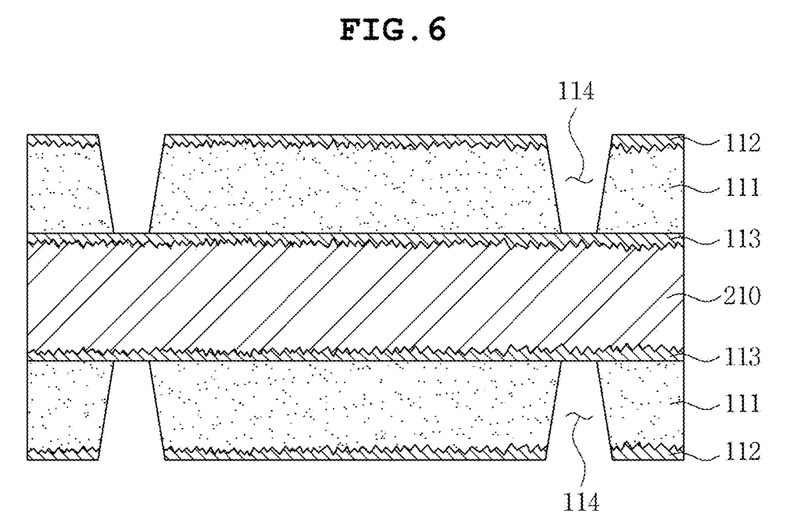

Referring to FIG. 6, a first via hole 114 may be formed in the copper clad laminate 110 (See FIG. 5). The first via hole 114 may be formed so as to penetrate through the first copper foil layer 112 and the insulating layer 111. The first via hole 114 may be formed using a laser drill. Here, the bottom surface of the first via hole 114 becomes a smooth surface of the second copper foil layer 113. When laser drill processing is performed, a residue of the insulating layer 111 remains on the bottom surface of the first via hole 114. The residue of the insulating layer 111 may be present between the roughnesses of the second copper foil layer 113. In order to remove the residue present on the bottom surface of the via hole 114 as described above, a desmear process may be performed. Here, since the smooth surface of the second copper foil layer 113, which is the bottom surface of the first via hole 114, has a low roughness, the residue is easily removed.

Figure 7:
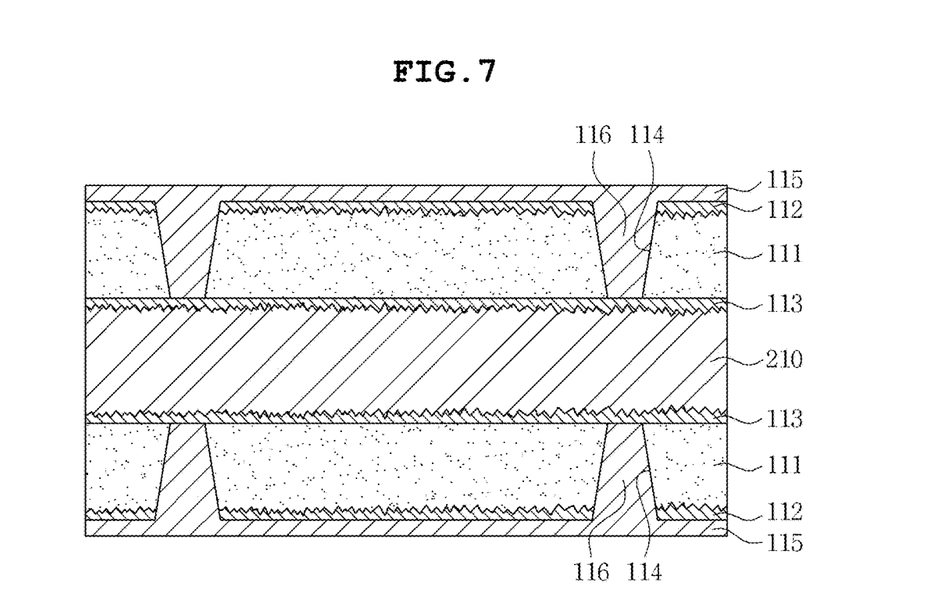

Referring to FIG. 7, a first plating layer 115 may be formed. The first plating layer 115 may be formed on one surface of the first copper foil layer 112 and in the first via hole 114. The first plating layer 115 may be formed by an electroless plating or electroplating method. However, the first plating layer 115 is not limited to being formed by the above-mentioned method, but may be formed by a plating method generally used in a field of a printed circuit board. An inner portion of the first via hole 114 is filled with the first plating layer 115, such that a first via 116 may be formed. In this case, since the bottom surface of the first via hole 114 is the smooth surface of the second copper foil layer 113, such that the residue is easily removed, the first via 116 may have sufficient close adhesion to the second copper foil layer 113.

Figure 8:
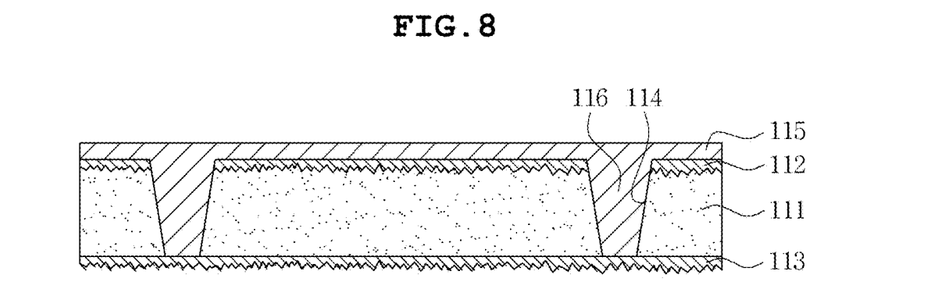

Referring to FIG. 8, the carrier substrate 210 may be removed. The carrier substrate 210 may be removed by a routing process. Here, a method of removing the carrier substrate 210 is not limited thereto. That is, a general method of removing the carrier substrate may be used.

When the carrier substrate 210 is removed, printed circuit boards 100 formed on one surface and the other surface of the carrier substrate 210 may be separated from each other. Here, the printed circuit board 100 may become the printed circuit board 100 (See FIG. 2) having the structure shown in FIG. 2. Since a process having the same sequence is performed on the separated printed circuit boards 100, one printed circuit board 100 will be shown and described.

Figure 9:
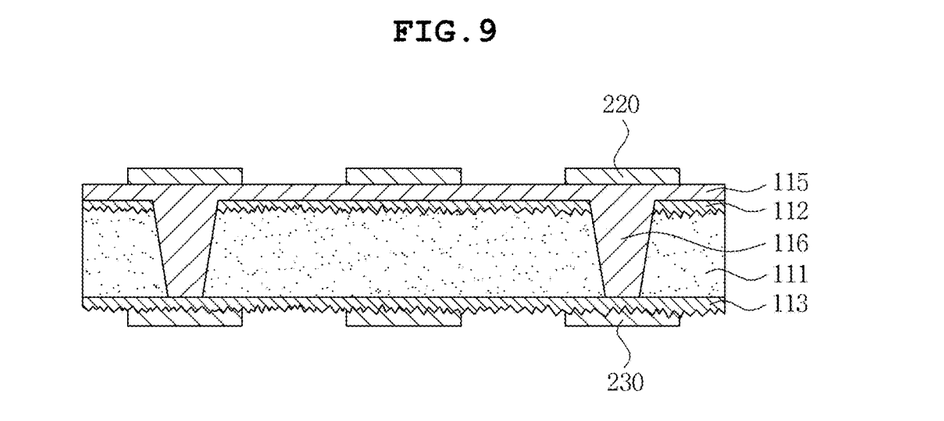

Referring to FIG. 9, first and second etching resists 220 and 230 may be formed. The first etching resist 220 may be formed on one surface of the first plating layer 115. The first etching resist 220 may be patterned so as to be positioned at a region at which a first circuit layer (not shown) is to be formed. The second etching resist 230 may be formed on the other surface of the second copper foil layer 113. The second etching resist 230 may be patterned so as to be positioned at a region at which a second circuit layer (not shown) is to be formed. That is, the first and second etching resists 220 and 230 may be formed in order to protect regions at which the first circuit layer (not shown) and the second circuit layer (not shown) are to be formed from an etching process.

Figure 10:
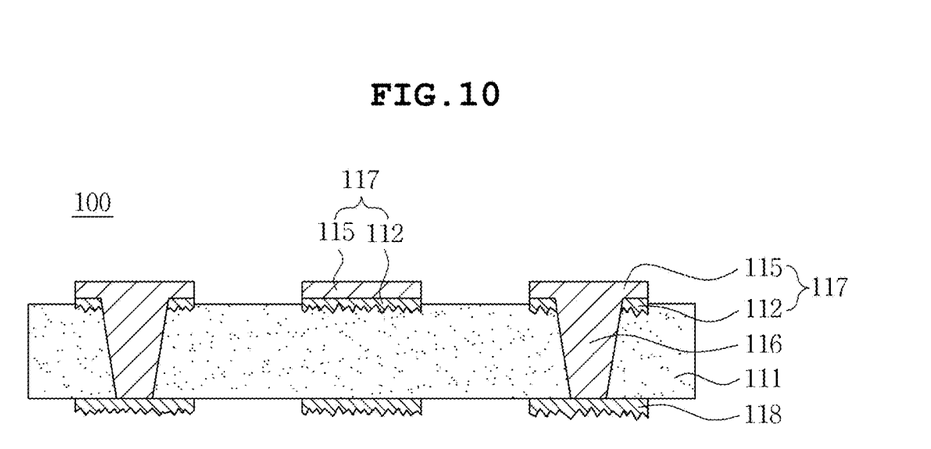

Referring to FIG. 10, the first and second circuit layers 117 and 118 may be formed. Etching may be performed on the first plating layer 115 and the second copper foil layer 113 having the first etching resist 220 and the second etching resist 230 formed thereon, respectively. In this case, the first copper foil layer 112 formed on the other surface of the first plating layer 115 may also be etched simultaneously. Alternatively, the first copper layer 112 may be etched after the first plating layer 115 is etched. After the etching is performed on the first plating layer 115, the copper foil layer 112, and the second copper foil layer 113, the first and second etching resists 220 and 230 may be removed. The first circuit layer 117 may include a patterned first plating layer 115 and first copper foil layer 112. In addition, the second circuit layer 118 may be a patterned second copper foil layer 113.

According to the preferred embodiment of the present invention, the first via 116 may electrically connect the first and second circuit layers 117 and 118 to each other.

Figure 11:
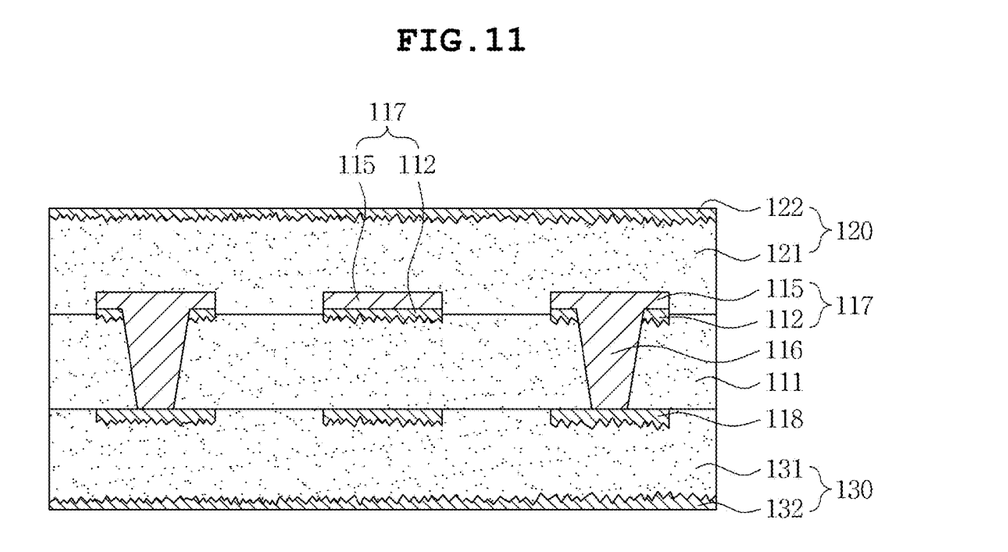

Referring to FIG. 11, first and second build-up substrates 120 and 130 may be stacked. According to the preferred embodiment of the present invention, the first build-up substrate 120 is formed on one surface of the insulating layer 111 and the first circuit layer 117. The first build-up substrate 120 may include a first build-up insulating layer 121 and a third copper foil layer 122.

The first build-up insulating layer 121 may be made of a composite polymer resin generally used as an interlayer insulating material. For example, the first build-up insulating layer 121 may be made of a prepreg or an Ajinomoto build-up film (ABF). In addition, the first build-up insulating layer 121 may be made of an epoxy resin such as FR-4 or bismaleimide triazine.

The third copper foil layer 122 may be formed on one surface of the first build-up insulating layer 121. One surface of the third copper foil layer 122 may be a smooth surface. In addition, the other surface of the third copper foil layer 122 may be a rough surface. Here, the rough surface may have a roughness larger than that of the smooth surface. The rough surface of the third copper foil layer 122 may contact one surface of the first build-up insulating layer 121.

According to the preferred embodiment of the present invention, the second build-up substrate 130 is formed on the other surface of the insulating layer 111 and the second circuit layer 118. The second build-up substrate 130 may include a second build-up insulating layer 131 and a fourth copper foil layer 132.

The second build-up insulating layer 131 may be made of a composite polymer resin generally used as an interlayer insulating material. For example, the second build-up insulating layer 131 may be made of a prepreg or an Ajinomoto build-up film (ABF). In addition, the second build-up insulating layer 131 may be made of an epoxy resin such as FR-4 or bismaleimide triazine. The first build-up insulating layer 121 and the second build-up insulating layer 131 are not limited to being made of the above-mentioned material, but may be made of an interlayer insulating material that may be generally used.

The fourth copper foil layer 132 may be formed on the other surface of the second build-up insulating layer 131. One surface of the fourth copper foil layer 132 may be a rough surface. In addition, the other surface of the fourth copper foil layer 132 may be a smooth surface. Here, the rough surface may have a roughness larger than that of the smooth surface. The rough surface of the fourth copper foil layer 132 may contact one surface of the second build-up insulating layer 131.

Figure 12:
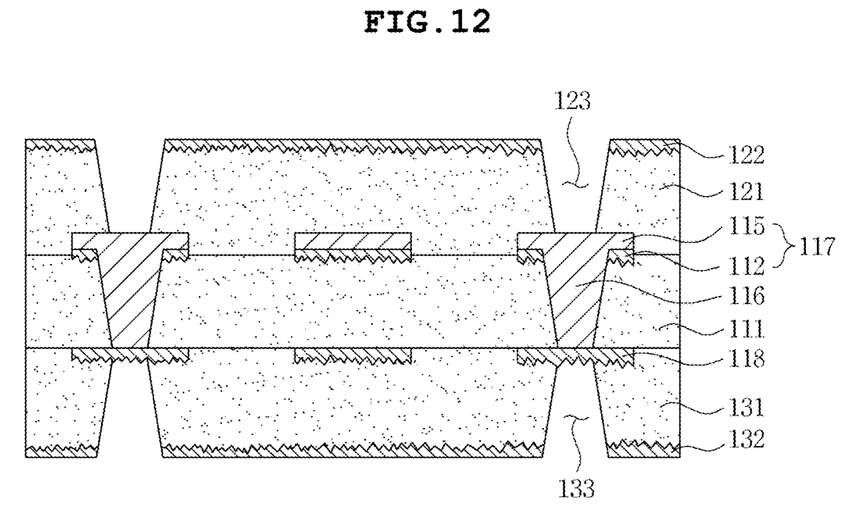

Referring to FIG. 12, second and third via holes 123 and 133 may be formed.

The second via hole 123 may be formed so as to penetrate through the first build-up substrate 120. The second via hole 123 may be formed using a laser drill. Here, the bottom surface of the second via hole 123 becomes a smooth surface of the first circuit layer 117. When laser drill processing is performed, a residue of the first build-up insulating layer 121 remains on the bottom surface of the second via hole 123. The residue of the first build-up insulating layer 121 may be present between the roughnesses of the smooth surface of the second circuit layer 118. In order to remove the residue, a desmear process may be performed. Here, since the bottom surface of the second via hole 123 has a low roughness, the residue is easily removed.

The third via hole 133 may be formed so as to penetrate through the second build-up substrate 130. The third via hole 133 may be formed using a laser drill. Here, the bottom surface of the third via hole 133 becomes a rough surface of the second circuit layer 118. After laser drill processing is performed, a desmear process is additionally performed, thereby making it possible to remove a residue remaining on the bottom surface of the third via hole 133.

Figure 13:
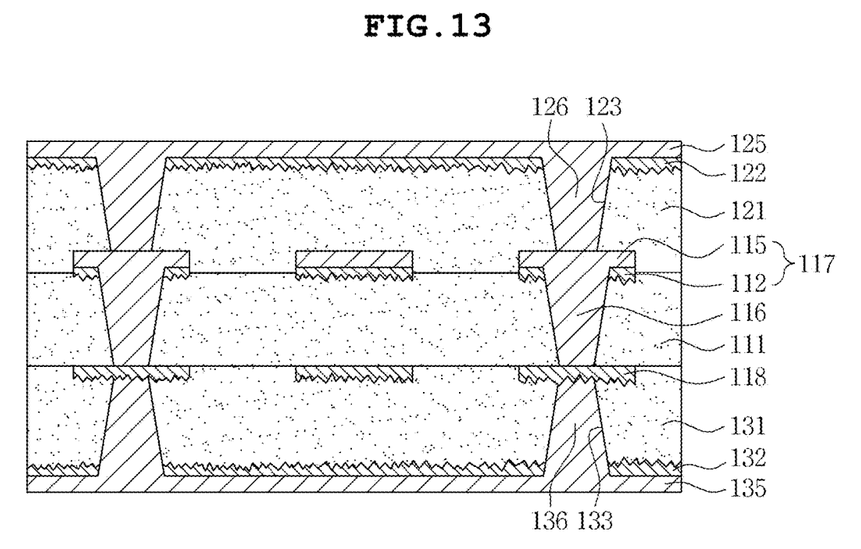

Referring to FIG. 13, second and third plating layers 125 and 135 may be formed. The second plating layer 125 may be formed on one surface of the third copper foil layer 122 and in the second via hole 123. An inner portion of the second via hole 123 is filled with the second plating layer 125, such that a second via 126 may be formed. Here, since the residue on the bottom surface of the second via hole 123 is sufficiently removed, the second via 126 may have sufficient close adhesion to the first circuit layer 117.

The third plating layer 135 may be formed on one surface of the fourth copper foil layer 132 and in the third via hole 133. An inner portion of the third via hole 133 is filled with the third plating layer 135, such that a third via 136 may be formed.

The second and third plating layers 125 and 135 may be formed by an electroless plating or electroplating method. However, the second and third plating layers 125 and 135 are not limited to being formed by the above-mentioned method, but may be formed by a plating method generally used in a field of a printed circuit board.

Figure 14:
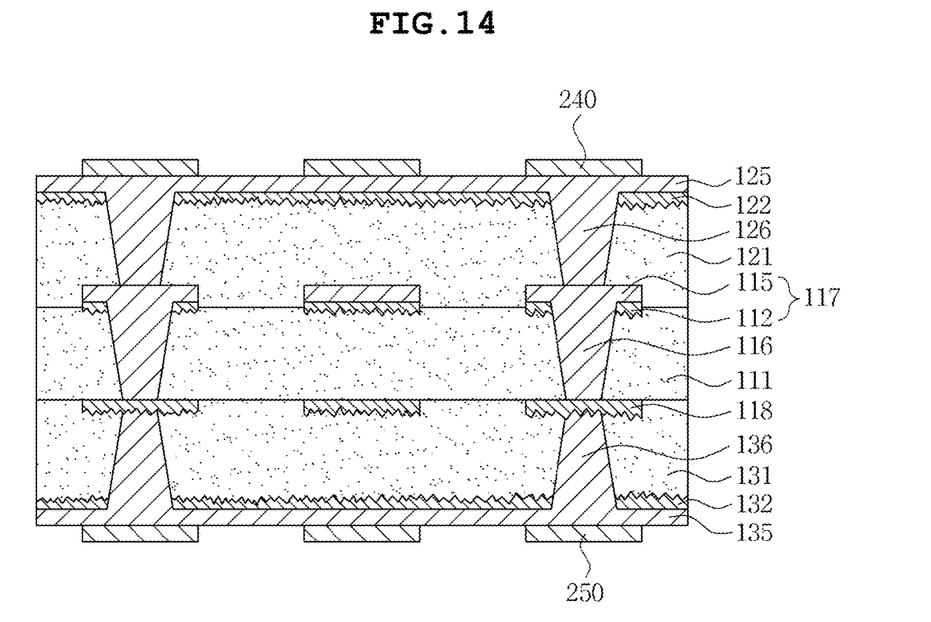

Referring to FIG. 14, third and fourth etching resists 240 and 250 may be formed. The third etching resist 240 may be formed on one surface of the second plating layer 125. The third etching resist 240 may be patterned so as to be positioned at a region at which a first build-up circuit layer (not shown) is to be formed. The fourth etching resist 250 may be formed on the other surface of the third plating layer 135. The fourth etching resist 250 may be patterned so as to be positioned at a region at which a second build-up circuit layer (not shown) is to be formed. That is, the third and fourth etching resists 240 and 250 may be formed in order to protect regions at which the first build-up circuit layer (not shown) and the second build-up circuit layer (not shown) are to be formed from an etching process.

Figure 15:
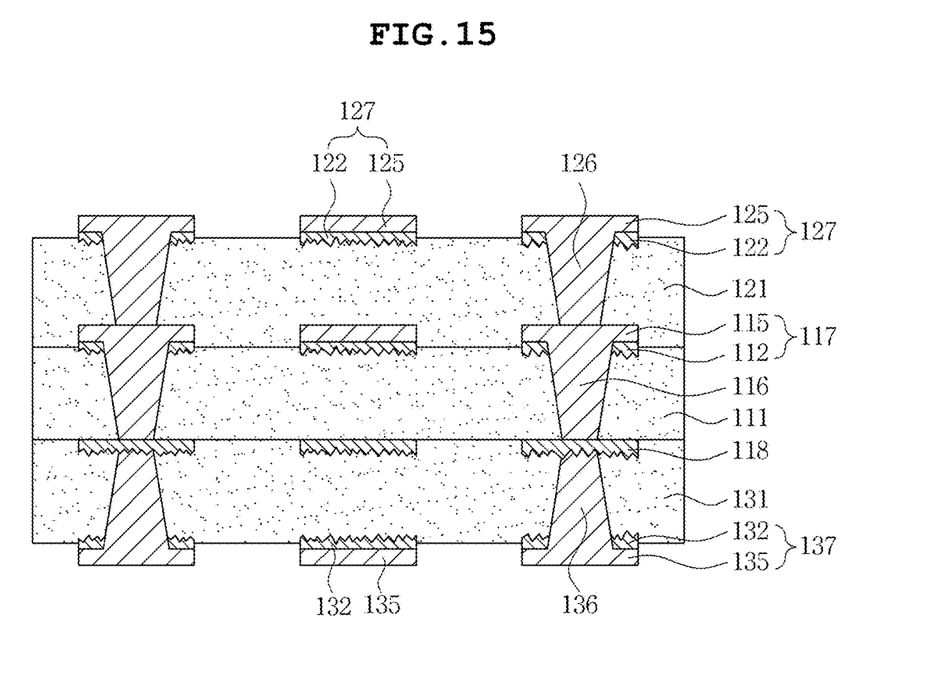

Referring to FIG. 15, the first and second build-up circuit layers 127 and 137 may be formed. Etching may be performed on the second and third plating layers 125 and 135 having the third and fourth etching resists 240 and 250 formed thereon, respectively. In this case, when the second plating layer 125 is etched, the third copper foil layer 122 formed on the other surface may also be etched simultaneously. Alternatively, the third copper foil layer 122 may be etched after the second plating layer 125 is etched. When the third plating layer 135 is etched, the fourth copper foil layer 132 formed on one surface may also be etched simultaneously. Alternatively, the fourth copper foil layer 132 may be etched after the third plating layer 135 is etched. After the etching is performed as described above, the third and fourth etching resists 240 and 250 may be removed. Here, the first build-up circuit layer 127 may include a second plating layer 125 and a third copper foil layer 122 patterned by the etching. In addition, the second build-up circuit layer 137 may include a third plating layer 135 and a fourth copper foil layer 132 patterned by the etching.

According to the preferred embodiment of the present invention, the second via 126 may electrically connect the first circuit layer 117 and the first build-up circuit layer 127 to each other. In addition, the third via 136 may electrically connect the second circuit layer 118 and the second build-up circuit layer 137 to each other.

The printed circuit board 200 including the first and second build-up layers 128 and 138 shown in FIG. 3 may be formed by the above-mentioned process.

Figure 16:
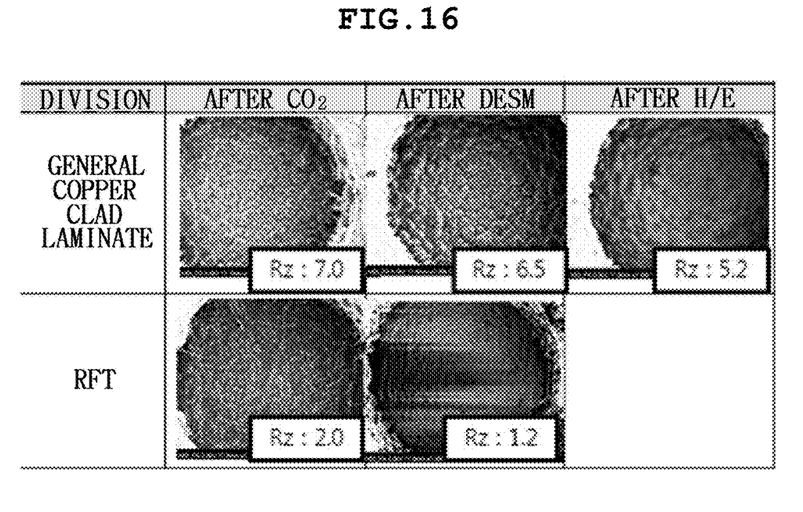
FIG. 16 is a view comparing the bottom surfaces of via holes according to the preferred embodiment of the present invention with those of via holes according to the prior art.

FIG. 16 is a view comparing the bottom surfaces of via holes according to the preferred embodiment of the present invention with those of via holes according to the prior art.

Referring to FIG. 16, roughnesses of the bottom surfaces 311, 312, and 313 of via holes according to the prior art and the bottom surfaces 321 and 322 of via holes according to the preferred embodiment of the present invention may be confirmed.

A compares roughnesses of the bottom surfaces of the via holes formed in each of the copper clad laminate according to the prior art and the copper clad laminate according to the preferred embodiment of the present invention with each other. In A, the roughness (Rz) of the bottom surface 311 of the via hole formed in the copper clad laminate according to the prior art is 7.0 μm. The roughness (Rz) of the bottom surface 321 of the via hole formed in the copper clad laminate according to the preferred embodiment of the present invention is 2.0 μm.

B compares roughnesses of the bottom surfaces of the via holes according to the prior art and the preferred embodiment of the present invention with each other in the case in which a desmear process is performed on the via holes according to the prior art and the preferred embodiment of the present invention. In B, the roughness (Rz) of the bottom surface 312 of the via hole 312 formed in the copper clad laminate according to the prior art after the desmear process is performed is 6.5 μm. The roughness (Rz) of the bottom surface 322 of the via hole formed in the copper clad laminate according to the preferred embodiment of the present invention when the desmear process is performed is 1.2 μm.

C shows a roughness of a bottom surface 313 after a desmear process and a half etching process are performed on the via hole formed in the copper clad laminate according to the prior art. In this case, the roughness of the bottom surface 313 of the via hole is 5.2 μm.

As a result of reviewing A, B, and C as described above, the via hole may have the bottom surface having a lower roughness in the case of using the copper clad laminate according to the preferred embodiment of the present invention as compared with the prior art. Particularly, the via hole according to the preferred embodiment of the present invention has a lower roughness in the case in which it is subjected only to the desmear process as compared with the case in which it is subjected to the desmear process and the half etching process according to the prior art. That is, the bottom surface of the via hole according to the preferred embodiment of the present invention has a roughness lower than that of the via hole according to the prior art, such that a residue of the insulating layer present between the roughnesses may be more easily removed. Therefore, the residue of the insulating layer may be more effectively removed in the preferred embodiment of the present invention than in the prior art, such that reliability of connection with a via to be later formed may be improved.

Further, according to the prior art, both of the desmear process and the half etching process should be performed in order to remove the residue of the insulating layer. On the other hand, according to the preferred embodiment of the present invention, the residue of the insulating layer may be sufficiently removed only by the desmear process. That is, according to the preferred embodiment of the present invention, the half etching process that has been performed according to the prior art may be omitted. Therefore, a process time and cost may be decreased.

In the method of manufacturing a printed circuit board according to the preferred embodiment of the present invention, a roughness (Rz) of the bottom surface of the via hole is maintained to be 2.0 to 2.5 μm, such that close adhesion between the via and the copper foil layer or the circuit layer may be 0.5 kg/cm or more. When the roughness (Rz) of the bottom surface of the via hole is less than 2.0 μm, peel strength is low, such that a delamination defect, or the like, may be generated due to internal or external impact. In addition, when the roughness (Rz) of the bottom surface of the via hole exceeds 2.5 μm, a residue of the insulating layer present between the roughnesses is not easily removed, such that sufficient close adhesion between the via and the copper foil layer or the circuit layer may not be maintained.

With the copper clad laminate, the printed circuit board, and the method of manufacturing the same according to the preferred embodiment of the present invention, the residue on the bottom surface of the via hole may be easily removed.

With the copper clad laminate, the printed circuit board, and the method of manufacturing the same according to the preferred embodiment of the present invention, close adhesion of the via may be improved.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A printed circuit board comprising:
    an insulating layer having one surface and the other surface;
    a first circuit layer formed on one surface of the insulating layer;
    a second circuit layer formed on the other surface of the insulating layer;
    a first build-up layer formed on the insulating layer and the first circuit layer and including a first build-up insulating layer and a first build-up circuit layer;
    a second build-up layer formed on the insulating layer and the second circuit layer and including a second build-up insulating layer and a second build-up circuit layer; and
    a via formed in at least one of the insulating layer, the first build-up layer, and the second build-up layer,
    wherein the first circuit layer, the second circuit layer, the first build-up circuit layer, and the second build-up circuit layer have one surface, which is a smooth surface, and the other surface, which is a rough surface having a roughness larger than that of the smooth surface, respectively, and the rough surfaces of the first circuit layer, the second circuit layer, and the first build-up circuit layer face the rough surface of the second build-up circuit layer.

2. The printed circuit board as set forth in claim 1, wherein the rough surfaces have a roughness (Rz) of 3.5 μm or more.

3. The printed circuit board as set forth in claim 1, wherein the smooth surfaces have a roughness (Rz) of 2.0 to 2.5 μm.

4. The printed circuit board as set forth in claim 1, wherein when the via is formed in the insulating layer, one surface of the via is connected to the rough surface of the first circuit layer and the other surface of the via is connected to the smooth surface of the second circuit layer.

5. The printed circuit board as set forth in claim 1, wherein when the via is formed in the first build-up insulating layer, one surface of the via is connected to the rough surface of the first build-up circuit layer and the other surface of the via is connected to the smooth surface of the first circuit layer.

6. The printed circuit board as set forth in claim 1, wherein when the via is formed in the second build-up insulating layer, one surface of the via is connected to the rough surface of the second circuit layer and the other surface of the via is connected to the rough surface of the second build-up circuit layer.

* * * * *